(12) United States Patent
Liu

(10) Patent No.: US 6,351,283 B1
(45) Date of Patent: Feb. 26, 2002

(54) CHARGE AMPLIFIER FOR MOS IMAGING ARRAY

(75) Inventor: Jun Liu, Fremont, CA (US)

(73) Assignee: OmniVision Technologies, Inc., Sunnyvale, CA (US)

( * ) Notice: Subject to any disclaimer, the term of this patent is extended or adjusted under 35 U.S.C. 154(b) by 0 days.

(21) Appl. No.: 08/755,576

(22) Filed: Nov. 27, 1996

Related U.S. Application Data

(63) Continuation-in-part of application No. 08/617,313, filed on Mar. 18, 1996, now Pat. No. 5,751,189, which is a continuation-in-part of application No. 08/538,441, filed on Oct. 3, 1995, now Pat. No. 5,724,095.

(51) Int. Cl.[7] .............................................. H04N 5/335
(52) U.S. Cl. ....................................... 348/301; 348/302
(58) Field of Search ................................. 348/241, 243, 348/245, 248, 249, 294, 300, 301, 302, 308, 311, 304, 305; 250/208.1; 257/222, 225, 231, 232; H04N 5/335

(56) References Cited

U.S. PATENT DOCUMENTS 4,746,804 A * 5/1988 Kitamura et al. ........... 348/241
5,708,471 A * 1/1998 Okumura .................... 348/310

\* cited by examiner

Primary Examiner—Tuan Ho
(74) Attorney, Agent, or Firm—Christensen O'Connor Johnson & Kindness PLLC

(57) ABSTRACT

An improved charge amplifier (105) for use in a MOS imaging array is disclosed. The charge amplifier comprises a reference capacitor ($C_r$), a sense capacitor ($C_s$), an operational amplifier (107), a first output capacitor ($C_{o1}$) connected to the output of the operational amplifier, a second output capacitor ($C_{o2}$) connected to the output of the operational amplifier, and a differential amplifier (109) connected to the first output capacitor and said second output capacitor. In operation, the reference capacitor is charged to a reference voltage. Similarly, the sense capacitor is charged to a reference voltage. Both the sense capacitor and the reference capacitor are formed to be identical. However, the reference capacitor is covered from ambient light and the sense capacitor is exposed to ambient light. As ambient light is incident on the sense capacitor, the voltage carried by the sense capacitor diminishes. After a predetermined exposure time, both the voltage stored across the reference capacitor and the sense capacitor is amplified by the operational amplifier. Next, the differential amplifier operates to provide an output signal that is the difference between said amplified version of said reference voltage and said amplified version of said signal voltage.

8 Claims, 2 Drawing Sheets

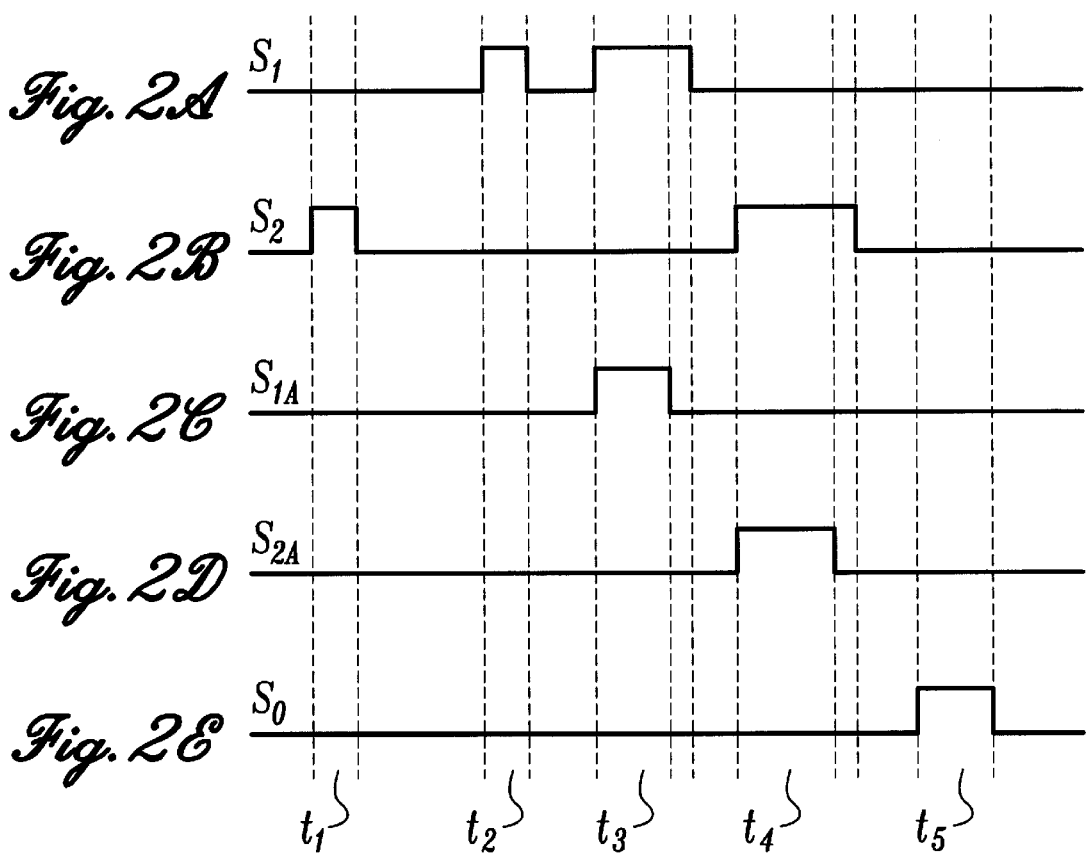
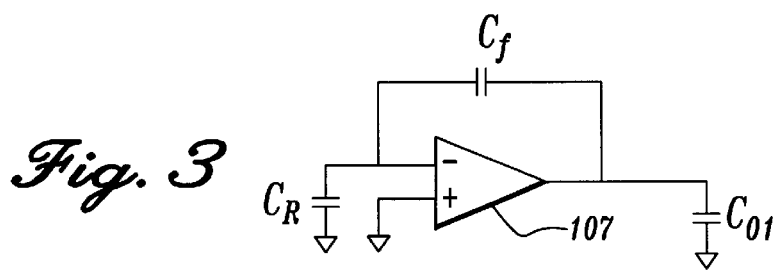
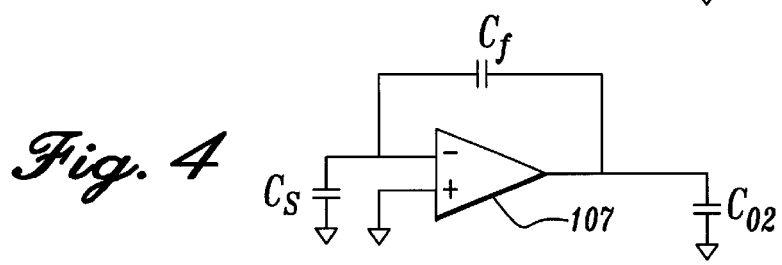
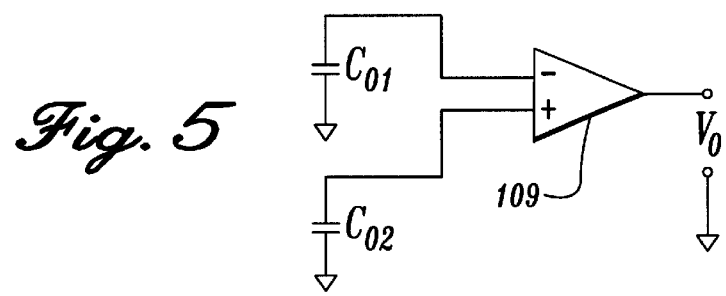

CHARGE AMPLIFIER FOR MOS IMAGING ARRAY

RELATED APPLICATIONS

This is a continuation-in-part of U.S. patent application Ser. No. 08/617,313 filed Mar. 18, 1996, now U.S. Pat. No. 5,751,189 which is a continuation-in-part of U.S. patent application Ser. No. 08/538,441 filed Oct. 3, 1995 now U.S. Pat. No. 5,724,095.

FIELD OF THE INVENTION

The present invention relates to metal oxide semiconductor imaging arrays, and more particularly, an improved charge amplifier for use in the array.

BACKGROUND OF THE INVENTION

Integrated circuit technology has revolutionized various fields including computers, control systems, telecommunications, and imaging. In the field of imaging, the charge coupled device (CCD) sensor has made possible the manufacture of relatively low cost and small hand-held video cameras. Nevertheless, the solid-state CCD integrated circuits needed for imaging are relatively difficult to manufacture, and therefore are expensive. In addition, because of the differing processes involved in the manufacture of CCD integrated circuits relative to MOS integrated circuits, the signal processing portion of the imaging sensor has typically been located on a separate integrated chip. Thus, a CCD imaging device includes at least two integrated circuits: one for the CCD sensor and one for the signal processing logic.

An alternative low cost technology to CCD integrated circuits is the metal oxide semiconductor (MOS) integrated circuit. Not only are imaging devices using MOS technology less expensive to manufacture relative the CCD imaging devices, for certain applications MOS devices are superior in performance. For example, the pixel elements in a MOS device can be made smaller and therefore provide a higher resolution than CCD image sensors. In addition, the signal processing logic necessary can be integrated alongside the imaging circuitry, thus allowing for a single integrated chip to form a complete stand alone imaging device.

Examples of MOS imaging devices are detailed in "A ¼ Inch Format 250K Pixel Amplified MOS Image Sensor Using CMOS Process" by Kawashima et al., *IEDM* 93-575 (1993), and "A Low Noise Line-Amplified MOS Imaging Devices" by Ozaki et al., *IEEE Transactions on Electron Devices*, Vol. 38, No. 5, May 1991. In addition, U.S. Pat. No. 5,345,266 to Denyer titled "Matrix Array Image Sensor Chip" describes a MOS image sensor. The devices disclosed in these publications provide a general design approach to MOS imaging devices.

The primary building block of an image formed by an MOS imaging device is a pixel. The number, size and spacing of the pixels determine the resolution of the image generated by the imaging device. The pixels of a MOS imaging device are semiconductor devices that transform incident light photons into current signals. The signal produced by each pixel is generally extremely small, in the nanoampere range. This small signal is unsuitable for further processing. Thus, a critical component of a MOS image sensor is a series of charge amplifiers that amplify the signals generated by the pixel elements. It is the charge amplifier design that is the subject of the present invention.

SUMMARY OF THE INVENTION

An improved charge amplifier for use in a MOS imaging array is disclosed. The charge amplifier comprises a reference capacitor, a sense capacitor, an operational amplifier, a first output capacitor connected to the output of the operational amplifier, a second output capacitor connected to the output of the operational amplifier, and a differential amplifier connected to the first output capacitor and said second output capacitor.

In operation, the reference capacitor is charged to a reference voltage. Similarly, the sense capacitor is charged to a reference voltage. Both the sense capacitor and the reference capacitor are formed to be identical. However, the reference capacitor is covered from ambient light and the sense capacitor is exposed to ambient light. As ambient light is incident on the sense capacitor, the voltage carried by the sense capacitor diminishes. After a predetermined exposure time, both the voltage stored across the reference capacitor and the sense capacitor is amplified by the operational amplifier. Next, the differential amplifier operates to provide an output signal that is the difference between said amplified version of said reference voltage and said amplified version of said signal voltage.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 2A–2E are timing diagrams illustrating the operation of the CMOS charge amplifier of FIG. 1A;

FIG. 3 is a circuit diagram illustrating the charge amplifier of FIG. 1A during a third time period;

FIG. 4 is a circuit diagram illustrating the charge amplifier of FIG. 1A during a fourth time period; and FIG. 5 is a circuit diagram illustrating the charge amplifier of FIG. 1A during a fifth time period.

DETAILED DESCRIPTION OF THE PREFERRED EMBODIMENT

Figure 1A:
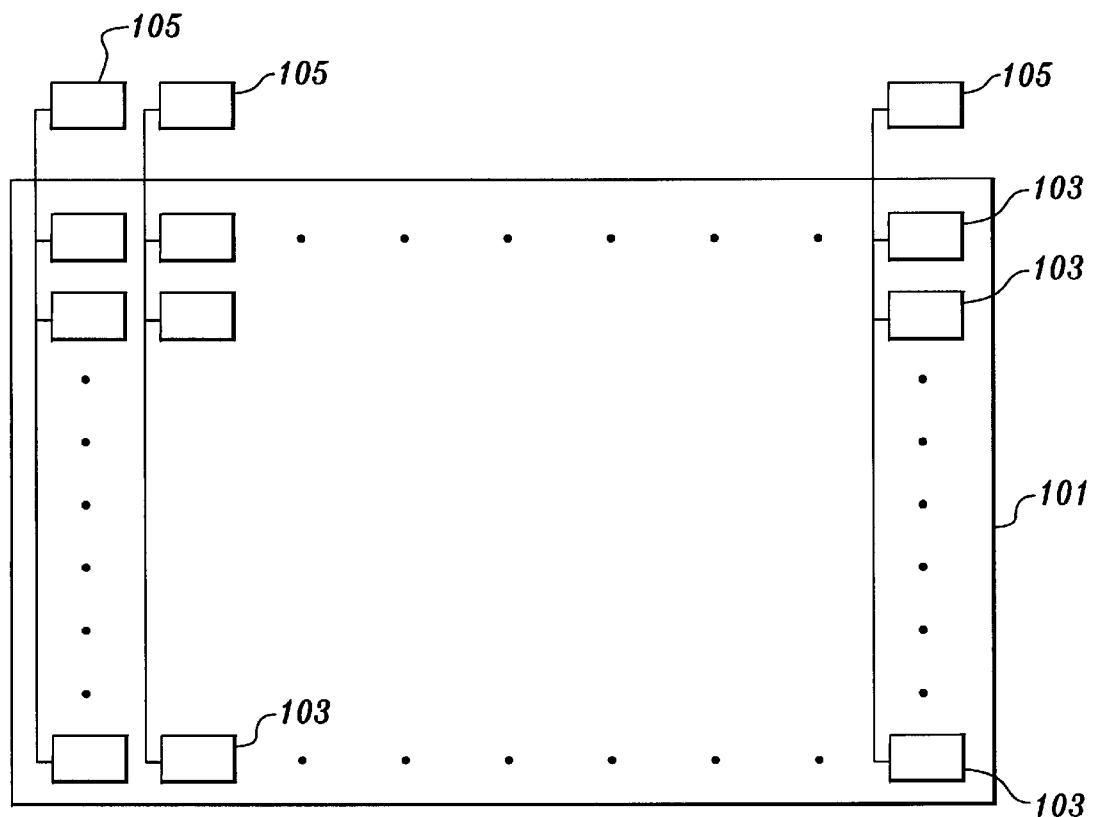
FIG. 1A is a schematic diagram of a CMOS imaging sensor.

With reference to FIG. 1A, a CMOS imaging array 101 in accordance with the present invention includes a rectangular matrix of pixels 103. The number of pixels in the horizontal or x-direction, and the number of pixels in the vertical or y-direction, constitutes the resolution of the imaging array 101. Each of the pixels 103 in a vertical column routes its signal to a single charge amplifier 105 (shown in greater detail in FIG. 1B). However, at any instant only one of the pixels 105 in a column sends a charge signal to the associated charge amplifier 105. Control circuitry of conventional design is operative to sequentially read the pixels 103 in a scanning manner.

Figure 1B:
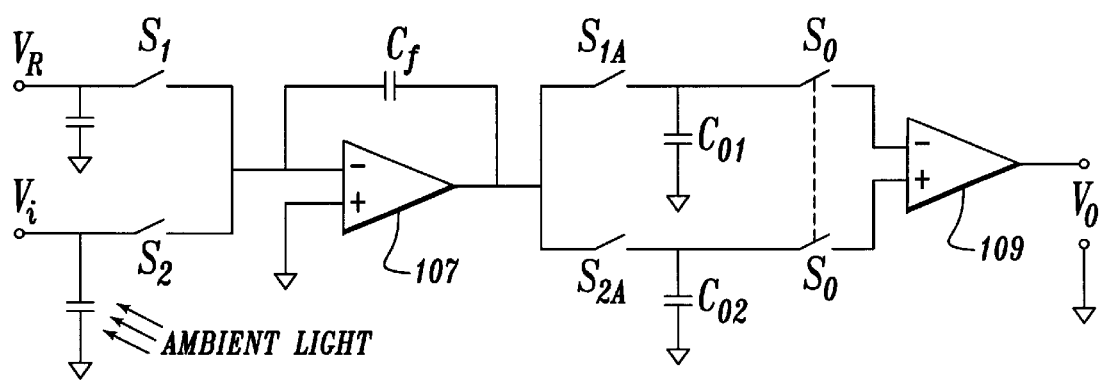
FIG. 1B is a schematic diagram of a CMOS charge amplifier formed in accordance with the present invention.

As seen in FIG. 1B, each charge amplifier 105 of the present invention (also referred to in the art as a sense amplifier) includes a sense capacitor $C_S$, a reference capacitor $C_r$, an operational amplifier 107, a feedback capacitor $C_f$, a first output capacitor $C_{o1}$, a second output capacitor $C_{o2}$, a differential amplifier 109, and switches $S_0$, $S_1$, $S_2$, $S_{1a}$, and $S_{2a}$.

A feedback capacitor $C_F$ is connected between the negative input and the output of the operational amplifier 107. In the preferred embodiment, the capacitors are formed by MOS devices. As described below, switches $S_0$, $S_1$, $S_2$, $S_{1a}$, and $S_{2a}$ control the routing of the input signal ($V_i$), reference voltage signal ($V_{REF}$) and feedback signal through the amplifier.

The reference capacitor $C_r$ is connected between ground and the inverting input of operation amplified 107. Between the reference capacitor $C_r$ and the inverting input to the operational amplifier 107 is switch $S_1$.

The sense capacitor $C_S$ is also connected between ground and the inverting input of the operational amplifier 107. Switch $S_2$ is placed between the sense capacitor $C_S$ and the inverting input to operational amplifier 107. Sense capacitor $C_S$ also stores the input signal $V_i$. Indeed, the sense capacitor $C_S$ is the sensing element used to determine the amount of ambient light incident on that particular pixel.

The non-inverting input of operational amplifier 107 is connected to ground. Alternatively, the non-inverting input of operational amplifier 107 may be connected to a second voltage reference. As noted above, the output of the operational amplifier 107 is fed back into the inverting input of the operational amplifier 107 through feedback capacitor $C_f$.

The output of operational amplifier 107 is provided via switch $S_{1a}$ to an input terminal of first output capacitor $C_{o1}$. The other terminal of the first output capacitor $C_{o1}$ is connected to ground. As seen in FIG. 1B, also connected to the input terminal of the first output capacitor $C_{o1}$ is switch $S_O$ that leads to the inverting input of differential amplifier 109.

The output of operational amplifier 107 is also provided via switch $S_{2a}$ to an input terminal of second output capacitor $C_{o2}$. The other terminal of the second output capacitor $C_{o2}$ is connected to ground. As seen in FIG. 1B, also connected to the input terminal of the second output capacitor $C_{o2}$ is switch $S_O$ that leads to the non-inverting input of differential amplifier 109.

Finally, the output of differential amplifier 109 provides the output signal $V_0$.

The operation of the charge amplifier 105 of FIG. 1B can be seen in greater detail with reference to the timing diagram of FIG. 2. During a first time period, $t_1$; switch $S_2$ is closed and the sense capacitor $C_S$ is charged to a reference voltage $V_r$. All of the other switches are open at this point. However, because the sense capacitor is exposed to ambient light, the voltage initially stored in sense capacitor $C_S$ ($V_r$) begins to decline as the ambient light strikes the sense capacitor $C_S$. Sense capacitors $C_S$ that behave in this manner are known in the art. Thus, the voltage across sense capacitor $C_S$ begins to decline from $V_r$ to a value $V_i$ as ambient light strikes the sense capacitor $C_S$. As will be seen in further detail below, the voltage $V_i$ will be reached at the beginning of a fourth time period $t_4$ when the signal carried across the sense capacitor $C_S$ is amplified. The time period from the charging of the sense capacitor $C_S$ until the beginning of the fourth time period $t_4$ is referred to as the "exposure time" because that is how long the sense capacitor $C_S$ will be exposed to the ambient light before the $V_i$ signal is amplified.

Next, during a second period, $t_2$, switch $S_1$ is closed and the reference capacitor $C_r$ is charged to the reference voltage $V_r$. All of the other switches are open at this point. Thus, both the sense capacitor $C_S$ and the reference capacitor $C_r$ are initially charged to the same reference voltage $V_r$. Because the reference capacitor $C_r$ is not exposed to ambient light, its voltage stays constant at $V_r$.

Next, at a third time period, $t_3$, switches $S_1$ and $S_{1a}$ are closed while all of the remaining switches are opened. The resulting circuit is shown in FIG. 3. During this third time period, the first output capacitor $C_{o1}$ carries an amplified version of the signal $V_r$ stored by reference capacitor $C_r$. It can be appreciated that under the circuit shown in FIG. 3, the voltage stored across first output capacitor $C_{o1}$ is equal to the voltage stored across reference capacitor $C_r$, $V_r$, multiplied by the ratio of $C_r/C_f$. Thus, the first output capacitor $C_{o1}$ stores a "baseline voltage" of $V_r$ amplified by the operational amplifier 107. The baseline voltage indicates the voltage output from a pixel that has no ambient incident light.

Next, at a fourth time period, $t_4$, switches $S_2$ and $S_{2a}$ are closed. The resultant circuit is shown in FIG. 4. Similar to the situation as described with reference to FIG. 3, the second output capacitor $C_{o2}$ carries the charge across the sense capacitor $C_S$, $V_i$, amplified by a factor of $C_S/C_f$. Therefore, the second output capacitor $C_{o2}$ contains the amplified version of $V_i$.

At this juncture, the first output capacitor $C_{o1}$ contains an amplified version of the signal carried by reference capacitor $C_r$. Similarly, the second output capacitor $C_{o2}$ will carry an amplified version of the signal carried by sense capacitor $C_S$. The voltage across the second capacitor $C_{o2}$ will usually be greater than that across the first capacitor $C_{o1}$ because the voltage $V_i$ will typically be less than the voltage $V_r$.

Finally, during a fifth time period, $t_5$, all switches are opened except for the pair of switches $S_O$. This allows the signals that are carried in the first and second output capacitors $C_{o1}$ and $C_{o2}$ to be input into differential amplifier 109. An equivalent circuit is shown in FIG. 5. The differential amplifier 109 serves, in a manner well known in the art, to provide an output that is the difference between its inverting and non-inverting inputs. This differential amplifier 109 provides an output that is the final output voltage $V_o$. The output voltage $V_o$ then indicates the amount of light incident upon the sense capacitor $C_S$ during the exposure time. The higher the value of $V_o$ the higher the amount of incident light on the sense capacitor $C_S$ during the exposure time. It should be noted that the sense capacitor $C_S$ and the reference capacitor $C_r$ are formed from exactly the identical dimensions and are identical in every way.

Further, in the preferred embodiment, the first and second time periods are 3480 nanoseconds, the fifth time period is 174 nanoseconds, and the third and fourth time periods $t_3$ and $t_4$ are 1044 nanoseconds.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of amplifying an ambient light signal from a pixel in a MOS imaging array, said pixel including a sensing element, the method comprising the steps of:

generating a reference voltage signal onto a reference element formed substantially identical to said sensing element, said reference element shielded from ambient light;

generating an ambient light signal by generating said reference voltage signal onto said sensing element and decreasing said reference voltage signal in a deterministic manner in response to incident ambient light;

amplifying said reference voltage signal to generate an amplified reference voltage signal;

amplifying said ambient light signal to generate an amplified ambient light signal; and generating an output signal as the difference between said amplified reference voltage signal and said amplified ambient light signal.

2. The method of claim 1 further including the step of amplifying said difference between said amplified reference voltage signal and said amplified ambient light signal.

3. The method of claim 1 further including the steps of:
storing said amplified reference voltage signal in a first storage capacitor;
storing said amplified ambient light signal in a second storage capacitor; and
providing said amplified reference voltage signal and said amplified ambient light signal to a differential amplifier for amplification.

4. A method of amplifying an ambient light signal generated by a pixel in a MOS imaging array, said pixel including a sensing element, the method comprising the steps of:
generating a reference voltage signal onto a reference element formed substantially identically to said sensing element;
generating onto said sensing element said reference voltage;
exposing said sensing element to ambient light, said ambient light causing said sensing element to deterministically decrease said reference voltage signal to said ambient light signal,
amplifying said reference voltage signal and said ambient light signal; and
calculating the difference between said reference voltage signal and said ambient light signal.

5. The method of claim 4 further including the step of amplifying said difference between said reference voltage signal and said ambient light signal.

6. The method of claim 5 further including the steps of:
storing said amplified reference voltage signal in a first storage capacitor;
storing said amplified ambient light signal in a second storage capacitor; and
providing said amplified reference signal and said amplified ambient light signal to a differential amplifier for amplification.

7. The method of claim 4 further including the steps of:
storing said amplified reference voltage signal in a first storage capacitor;
storing said amplified ambient light signal in a second storage capacitor; and
providing said amplified reference signal and said amplified ambient light signal to a differential amplifier for amplification.

8. An improved charge amplifier for use in a MOS imaging array and for amplifying a signal voltage, said charge amplifier comprising:
an operation amplifier having an inverting input and an amplifier output terminal for outputting an amplifier signal;
a feedback capacitor connected between said inverting input and said amplifier output terminal;
a reference capacitor for storing a reference voltage, said reference capacitor connected to said inverting input;
a sense capacitor for carrying said signal voltage, said sense capacitor connected to said inverting input;
a first output capacitor connected to said amplifier output terminal and for storing an amplified version of said reference voltage;
a second output capacitor connected to said amplifier output terminal and for storing an amplified version of said signal voltage; and
a differential amplifier connected to said first output capacitor and said second output capacitor, said differential amplifier providing an output signal that is the difference between said amplified version of said reference voltage and said amplified version of said signal voltage.

* * * * *